(12) United States Patent
Kannengiesser et al.

(10) Patent No.: US 11,243,277 B2
(45) Date of Patent: Feb. 8, 2022

(54) PASSIVE FIELD CAMERA AND METHOD FOR OPERATING THE PASSIVE FIELD CAMERA

(71) Applicant: Siemens Healthcare GmbH, Erlangen (DE)

(72) Inventors: Stephan Kannengiesser, Wuppertal (DE); Robert Rehner, Neunkirchen am Brand (DE); Stefan Popescu, Erlangen (DE); Gudrun Ruyters, Erlangen (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/800,199

(22) Filed: Feb. 25, 2020

(65) Prior Publication Data

US 2020/0292645 A1   Sep. 17, 2020

(30) Foreign Application Priority Data

Mar. 13, 2019 (EP) .................................. 19162536

(51) Int. Cl.
  *G01R 33/36* (2006.01)
  *G01R 33/48* (2006.01)
(52) U.S. Cl.
  CPC .............. *G01R 33/36* (2013.01); *G01R 33/48* (2013.01)
(58) Field of Classification Search
  CPC ................................ G01R 33/36; G01R 33/48
  See application file for complete search history.

(56) References Cited

U.S. PATENT DOCUMENTS

| | | | |
|---|---|---|---|
| 4,680,594 A | 7/1987 | Bracht | |
| 5,543,711 A * | 8/1996 | Srinivasan | ....... G01R 33/34046 324/318 |

(Continued)

FOREIGN PATENT DOCUMENTS

| | | |
|---|---|---|
| DE | 10201421341 A1 | 1/2016 |
| EP | 1582886 A1 | 10/2005 |

(Continued)

OTHER PUBLICATIONS

Chu, Ying-Hua, et al. "Accurate dynamic magnetic field monitoring and diffusion-weighted image reconstruction using uncorrelated local field measurements." Apr. 22-27, 2017. pp. 1-3.

(Continued)

*Primary Examiner* — Dixomara Vargas
(74) *Attorney, Agent, or Firm* — Lempia Summerfield Katz LLC

(57) ABSTRACT

The disclosure relates to a field camera and a method for measuring a magnetic field distribution using a magnetic resonance tomograph and the field camera. The field camera has a number of samples, which are distributed over a spatial volume to be measured, and a number of receive antennas. In an act of the method, a sensitivity matrix for the receive antennas, for each sample at each receive antenna, is captured using the magnetic resonance tomograph. In another act, antenna signals of the samples in a magnetic field to be measured are captured by the receive antennas, using the magnetic resonance tomograph. Finally, magnetic resonance signals of the individual samples are determined from the antenna signals as a function of the sensitivity matrix, using a controller. In a further act, the magnetic field strength at the location of the samples may be determined from the magnetic resonance signals.

20 Claims, 3 Drawing Sheets

(56) References Cited

U.S. PATENT DOCUMENTS

| | | | | |
|---|---|---|---|---|
| 6,029,082 | A * | 2/2000 | Srinivasan | G01R 33/34046 324/318 |
| 7,764,065 | B2 | 7/2010 | Biber | |
| 8,487,615 | B2 * | 7/2013 | Zhu | G01R 33/34 324/307 |
| 9,759,787 | B2 * | 9/2017 | Oomen | G01R 33/34023 |
| 9,958,523 | B2 * | 5/2018 | Kim | G01R 33/4835 |
| 10,012,708 | B2 * | 7/2018 | Ryu | G01R 33/3456 |
| 10,670,678 | B2 * | 6/2020 | Beck | G01R 33/56308 |
| 2004/0137872 | A1 * | 7/2004 | Srinivasan | G01R 33/34046 455/344 |
| 2005/0007116 | A1 * | 1/2005 | Davis | G01R 33/365 324/318 |
| 2005/0024054 | A1 * | 2/2005 | Rinneberg | G01R 33/341 324/318 |
| 2007/0016003 | A1 * | 1/2007 | Piron | A61B 90/11 600/415 |
| 2008/0197849 | A1 * | 8/2008 | Heid | G01R 33/56375 324/318 |
| 2009/0027053 | A1 * | 1/2009 | Decke | A61B 5/055 324/318 |
| 2012/0268132 | A1 * | 10/2012 | Zhu | G01R 33/3692 324/322 |
| 2013/0221966 | A1 * | 8/2013 | Zhu | G01R 33/3642 324/318 |
| 2014/0111201 | A1 * | 4/2014 | Kim | G01R 33/4835 324/309 |
| 2014/0132261 | A1 * | 5/2014 | Kim | G01R 33/4835 324/309 |
| 2014/0132264 | A1 * | 5/2014 | Kim | G01R 33/4835 324/309 |
| 2014/0218025 | A1 * | 8/2014 | Wong | G01R 33/44 324/309 |
| 2015/0061668 | A1 * | 3/2015 | Dannels | G01R 33/56554 324/309 |
| 2015/0204954 | A1 * | 7/2015 | Reykowski | G01R 33/3614 324/322 |
| 2015/0285891 | A1 * | 10/2015 | Dannels | G01R 33/56554 324/309 |
| 2016/0011284 | A1 | 1/2016 | Popescu | |
| 2016/0022142 | A1 * | 1/2016 | Bradshaw | G01R 33/3415 600/415 |
| 2016/0084926 | A1 * | 3/2016 | Kim | G01R 33/34046 324/322 |
| 2016/0291100 | A1 * | 10/2016 | Ha | G01R 33/3607 |
| 2018/0074221 | A1 * | 3/2018 | Reiderman | G01V 3/28 |
| 2018/0321339 | A1 * | 11/2018 | Yang | G01R 33/3415 |

FOREIGN PATENT DOCUMENTS

| | | |
|---|---|---|
| EP | 2515132 A1 | 10/2012 |
| WO | WO2018069050 A1 | 4/2018 |

OTHER PUBLICATIONS

Chu, Ying-Hua, et al. "Decoupled dynamic magnetic field measurements improves diffusion-weighted magnetic resonance images." Scientific reports 7.1 (2017): 1-12.

Tang, Joel A., and Alexej Jerschow. "Practical aspects of liquid-state NMR with inductively coupled solenoid coils." Magnetic Resonance in Chemistry 48.10 (2010): 763-770.

Webb, A. G. "Radiofrequency microcoils for magnetic resonance imaging and spectroscopy." Journal of Magnetic Resonance 229 (2013): 55-66.

European Search Report for European Application No. 19162536.7-1022 dated Aug. 10, 2019.

\* cited by examiner

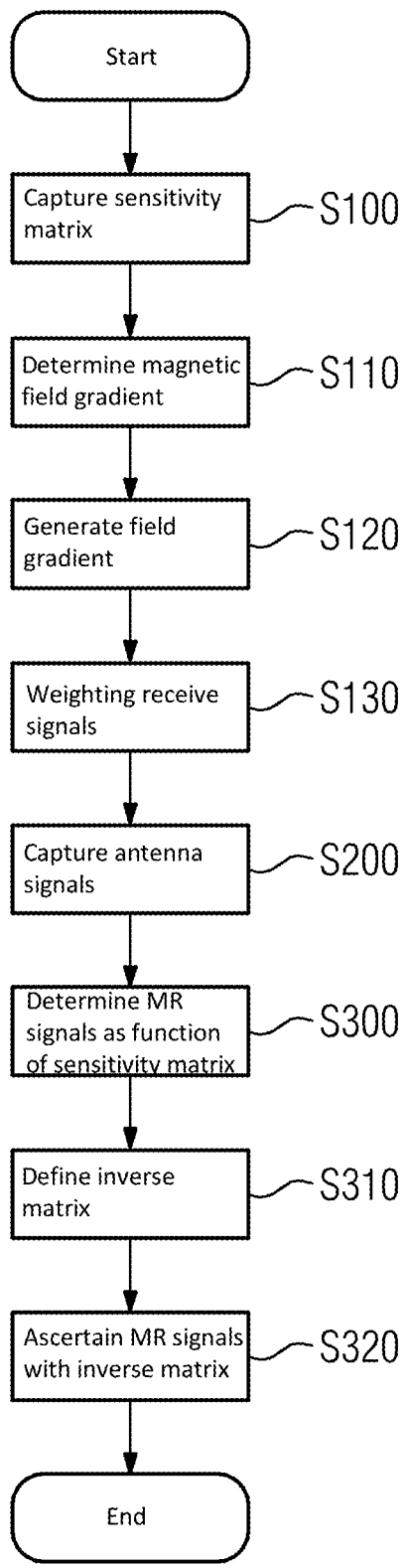

PASSIVE FIELD CAMERA AND METHOD FOR OPERATING THE PASSIVE FIELD CAMERA

The present patent document claims the benefit of European Patent Application No. 19162536.7, filed Mar. 13, 2019, which is hereby incorporated by reference.

TECHNICAL FIELD

The disclosure relates to a field camera for capturing a magnetic field distribution by a magnetic resonance measurement using a plurality of samples distributed over a spatial volume. The disclosure further relates to a method for field measurement using the field camera and a magnetic resonance tomograph.

BACKGROUND

Magnetic resonance tomographs are imaging devices which, for the purpose of depicting an examination object, align nuclear spins of the examination object by a strong external magnetic field, and excite the nuclear spins by a magnetic alternating field in order to achieve precessional motion about this alignment. The precessional motion or return of the spins from this excited state to a state having less energy in turn generates a magnetic alternating field as a response, which is received via antennas.

A spatial encoding is impressed on the signals with the aid of magnetic gradient fields, which then allows an assignment of the received signal to a volume element. The received signal is then evaluated, and a three-dimensional imaging representation of the examination object is provided.

The quality of the generated images in this case is heavily dependent both on the homogeneity of the static magnetic field and on the linearity of the gradient fields used for spatial encoding. These are also influenced by dynamic effects such as eddy currents, which are caused by rapidly alternating gradient fields. Devices for the spatial capture of the magnetic fields are also referred to as field cameras.

For example, German Patent Application DE 10 2014 213 413 discloses a method and a device for measuring a magnetic field in a magnetic resonance tomography facility using at least one field sensor, to which at least one generated erase signal may be applied in order to reduce a residual magnetization in the at least one field sensor (FS).

For the purpose of evaluating the signals of the field sensors, existing field cameras have individual antenna coils at the field sensors and separate receivers, representing a considerable expense if a multiplicity of field sensors are used in order to increase the spatial resolution.

SUMMARY AND DESCRIPTION

The object of the disclosure is therefore to develop the magnetic field measurement more simply and economically in a magnetic resonance tomograph.

The object is achieved by a field camera and a method for operating a magnetic resonance tomograph with a field camera. The scope of the present disclosure is defined solely by the appended claims and is not affected to any degree by the statements within this summary. The present embodiments may obviate one or more of the drawbacks or limitations in the related art.

The field camera has a number of M samples. Samples in this case refer to volumes in which there is a medium whose nuclear spins have a magnetic resonance. In the simplest case, these may be cells which are filled with water. The material of the cell may have few or no diamagnetic or paramagnetic properties, e.g. expanded polystyrene, and is moreover shaped as a spherical shell or ellipsoid in order to minimize field distortions of the magnetic field. The samples may have a small volume relative to the spatial volume to be measured, being smaller than the spatial volume to be measured by a factor of, e.g., 10, 50, 100, or 1000.

The samples are distributed over the spatial volume to be measured. This is understood to mean that the spatial volume is divided into M separate sub-volumes of equal size, and that only one sample is arranged in each of the sub-volumes. It is also possible for the distance between two adjacent samples to be no less than a predetermined minimum distance. The minimum distance may be greater than the greatest extent of the sample in a spatial direction, by a factor of more than 5, 10, 20, or 100. Distributed may also be considered to signify that only one sample in each case is arranged in each of the receive volumes explained below. It is also possible for the samples to be arranged on one or more concentric shells, e.g., spherical shells, around or within the spatial volume. On the basis of the field equations for magnetic fields, the magnetic field in the interior may advantageously be deduced from the measured values of the shell, and the arrangement in a shell assists the determination as described below of an inverse matrix in order to deduce the magnetic resonance signals of the individual samples from the signals of receive antennas. In one embodiment, there is at least one distinct axis for which it is the case that only one sample is ever arranged on a plane perpendicular to the axis.

The field camera has a number of N receive antennas for a magnetic resonance signal. The receive antennas may be antenna coils, for example, such as those also used in local coils. The receive antennas each have a receive volume. A receive volume in this case is considered to be a volume in which the magnetic resonance signal produced in the receive antenna by the sample is not attenuated by more than 6 dB, 12 dB, 18 dB, 40 dB, or 60 dB relative to a maximum level that may be generated by the sample. In the case of an annular antenna coil, the maximum magnetic resonance signal is obtained with a sample in the immediate vicinity of the coil conductor, for example.

The receive antennas are arranged relative to the spatial volume to be measured in such a way that two of the M samples are arranged in at least one of the receive volumes, the receive volumes being at least partially separate. At least one sample is situated in each of the receive volumes. For example, the samples may be arranged in a grid and located in a cube or a cylinder, on the outside of which the receive antennas are arranged in all three spatial directions. For example, it is conceivable to arrange a phantom, which is made of a structural element containing distributed samples, in a head coil as a field camera.

The number N of receive antennas is greater than or equal to the number M of samples in this case.

By virtue of the N receive antennas arranged around the M samples, the field camera advantageously allows the magnetic resonance signals of the M samples to be reconstructed from the N receive signals as a result of the condition N≥M, and thus allows the magnetic fields to be determined at M positions in the spatial volume that is to be measured, as explained in greater detail in the following method. The field camera also makes it possible to use existing local coils as part of the field camera and thus to reduce the expense.

The method is used to measure a magnetic field distribution using a magnetic resonance tomograph and a field camera. In an act of the method, a sensitivity matrix is defined for the receive antennas, wherein for each receive antenna n, a sensitivity $E_{mn}$ is measured with which a signal of the sample m is received by this antenna. This sensitivity may be specified relative to the other antennas or in absolute terms, e.g., in microvolt amplitude of the received magnetic resonance signal $A_n$ of a receive antenna n for a predetermined excitation of the sample m. The measurement of the amplitudes may be performed using the receivers of the magnetic resonance tomograph, which are also used for image reconstruction. It is however also conceivable to use separate receivers for this purpose.

In order to achieve this, the signals of the individual samples are separated or distinguished when the sensitivity matrix is captured. For example, it is possible by a gradient of the magnetic field to separate the frequencies of the individual samples when the magnetic resonance signal is received, such that the signals may be distinguished. It is however also conceivable selectively to excite only individual samples by a single gradient field when exciting the nuclear spin, if these are suitably arranged relative to the direction of the gradient.

Finally, it would also be possible effectively to achieve the selectivity for individual samples by arranging suitable activation devices at the samples. For example, coils at the samples may be used for the purpose of selection, generating an additional local static magnetic field or destroying the coherent excitation by a magnetic alternating field. It is also conceivable by switchable screening at the individual samples selectively to prevent the excitation or the emission of the MRT signal.

It is also possible to establish the sensitivity of the individual receive antennas by an image capture of the samples using a receive antenna and the body coil in each case, and to determine the relative sensitivity of the receive antennas for the individual samples from the ratio of the intensity values for the individual samples.

This may be achieved more quickly if, instead of a complete 3-dimensional capture, only one or more projections in two or even only one dimension are captured from one or more different directions and their intensity values evaluated. The projections may be obtained by applying no magnetic field gradient or only one magnetic field gradient (e.g. Gx or Gy) when the MR signals are captured. The complete sampling of the k-space is therefore omitted. The phase coding for the sampling of the whole space may therefore be omitted.

If the magnetic resonance signals of the individual samples may be distinguished or if only one sample is excited in each case, it is possible to determine for every sample m the absolute or relative sensitivity with which the N receive antennas capture the magnetic resonance signals of the sample m in each case. The coefficients of the sensitivity matrix $E_{mn}$ may be captured in parallel or also sequentially in this way.

In a further act of the method, N antenna signals $A_n$ of the M samples in a magnetic field to be measured are captured by the N receive antennas. In contrast with the measurement of the signals for the purpose of defining the sensitivity matrix $E_{mn}$, it is no longer necessary in this case for the magnetic resonance signals to differ in frequency or be captured sequentially. The capture of the antenna signals may be performed by the receivers of the magnetic resonance tomograph.

In a further act of the method, M magnetic resonance signals $S_m$ of the individual samples are determined from the N antenna signals $A_n$ as a function of the sensitivity matrix $E_{mn}$. This involves resolving the system of equations $A_n = E_{mn} \times S_m$ according to the magnetic resonance signals $S_m$ of the samples. Various advantageous solution methods are set forth in the disclosure below and in the description of the figures.

The frequency of the separated magnetic resonance signals of the samples then provides a measure for the local static magnetic field at the location of the samples. The result may then be displayed or used to calibrate subsequent measurements.

The method may advantageously be performed in parallel and therefore quickly and without additional devices, using a relatively simple arrangement of samples in a structural body and a local coil matrix, e.g. a head coil. A material without particular characteristic electrical or magnetic properties, e.g., a non-conductor with a relative dielectric constant and susceptibility constant close to 1 and a Larmor frequency other than that of the samples may be used as a structural body in this case, e.g. expanded polystyrene.

In a possible embodiment variant of the field camera, the N receive antennas at least partially surround the outer extent of the spatial volume to be measured. In this case, the spatial volume to be measured includes at least the volume which surrounds the samples, in other words the contiguous space in which the samples are arranged. In the context of the disclosure, at least partially surrounding the outer extent signifies that the receive antennas are arranged around the samples in at least three of the six Cartesian spatial coordinates. For example, the spatial volume may describe a cuboid or a sphere, which is arranged along the z-axis or the direction of the B0 field of a magnetic resonance tomograph, and receive antennas are arranged at the outer walls in +/−x-direction and +/−y-direction. The samples are arranged therein, e.g., in a grid or on one or two concentric spherical shells. Two concentric spherical shells are also possible. A cylinder whose curved surface is formed by a rolled-up antenna array is also possible. Receive antennas may also be arranged in all 6 spatial directions on surfaces of a surrounding prism or cube, for example.

By arranging the receive antennas around the outer extent, it is advantageously provided that all samples are captured by the receive antennas and also weighted differently, and therefore the sensitivity matrix is not underdetermined.

In a possible embodiment variant of the field camera, at least one sample has an inductively coupled first resonant circuit at the Larmor frequency. The sample having a first resonant circuit is understood to mean that the first resonant circuit primarily interacts with this one sample at which it is arranged. The signal of the assigned sample generates e.g., a resonance signal in the resonant circuit, the signal being more than 6 dB, 12 dB, or 18 dB greater than a signal induced by an adjacent sample when using the same excitation. It is significant in this case that the interaction of the resonant circuit differs with different samples, such that a distinction is possible with the aid of the sensitivity matrix. This may be achieved, for example, if the first resonant circuit has an inductance in the form of a coil which surrounds the sample at a distance that is smaller than a dimension of the sample in a plane in which the coil lies. The Larmor frequency in this case is considered to be the frequency at which the nuclear spins of the sample have a magnetic resonance signal in a static B0 field of a magnetic resonance tomograph that is to be measured, e.g., at 1.5 T, 3 T, 7 T. In order to achieve a resonance, in addition to the coil with its natural capacitance, the resonant circuit may also have a capacitor.

A first resonant circuit advantageously amplifies a signal of the sample by a local increase of the field strength of the excitation pulse and a resonant amplification of the magnetic resonance signal when received, so that the magnetic field measurement may be performed more quickly and reliably.

In a possible embodiment variant, the field camera has a second resonant circuit with an identical resonant frequency to that of the first resonant circuit. The first resonant circuit is inductively coupled to the second resonant circuit, and the second resonant circuit has a larger induction surface than the first resonant circuit. In this case, an inductive coupling is considered to occur in particular if, given a magnetic alternating field which penetrates both resonant circuits homogeneously at the resonant frequency of both resonant circuits, the amplitude of the currents in the first resonant circuit is greater by 3 dB, 6 dB, 12 dB, or more than the amplitude in the first resonant circuit without the second resonant circuit. An identical resonant frequency in this case is considered to be a frequency which, in the coupled system, generates an amplitude in the respective resonant circuit which is lower by 12 dB, 6 dB, or 3 dB relative to an amplitude in the case of an identical alternating field at the free natural resonant frequency of the resonant circuit. It is also possible in this case for the first resonant circuit to have a different spatial orientation than the second resonant circuit, e.g., an angle between a normal vector of an antenna coil of the first resonant circuit and a normal vector of an antenna coil of the second resonant circuit is greater than 10 degrees, 20 degrees, or 30 degrees. It is also possible for a plurality of first resonant circuits to inductively couple a plurality of samples with a shared second resonant circuit.

Due to its larger surface, the second resonant circuit may advantageously improve the coupling between both a transmit antenna for excitation pulses and the samples on one hand and/or the receive antennas and the samples on the other hand, such that the temporal resolution may be improved by shorter measuring times or the spatial resolution may be improved by smaller samples. In the case of different alignments, it is moreover possible to improve a coupling to the excitation pulses, which may move towards zero in the worst case, if the field vectors of the excitation field are parallel to the surface of the antenna coil of the first resonant circuit.

In a possible embodiment variant of the local coil, the resonant circuit has a coil and a capacitor, the capacitor being formed from twisted insulated conductor ends of the coil.

The lacquer-insulated twisted conductor ends form, by the opposing conductors which are insulated from each other in the region of the capacitor, a small capacitor of high quality for the resonant circuit, which capacitor does not require additional and mechanically vulnerable soldering joints or materials that may interfere with the magnetic resonance measurement.

It is also possible in this case for the resonant circuit to have two resonant frequencies, e.g., by including two oscillating circuits for different resonant frequencies that are coupled together.

The resonant circuit with dual resonance advantageously allows the provision of a field camera for two different B0 magnetic field strengths such as 1.5 T and 3 T.

In a possible embodiment variant, the method includes the act of defining an inverse matrix $I_{nm}$ to the sensitivity matrix $E_{mn}$.

The term inverse matrix is not restricted here to the narrower mathematical term for quadratic matrices where M=N, but also includes, e.g., the so-called pseudo-inverse matrices where N>M, e.g., the Moore-Penrose inverse.

In order to achieve this, the system of equations of the sensitivity matrix $E_{mn}$ is not underdeterminate. In the case of a quadratic matrix, this is established if the determinant is not equal to zero. This may be achieved by distributing samples and receive antennas in a suitable manner, such that non-identical signals or signal combinations of the same samples are captured in two different receive antennas. For this, the number N of receive antennas is at least as great as the number M of samples.

If the system of equations is overdeterminate, (e.g., the number of receive antennas N is greater than the number of samples M and the arrangement of the samples relative to the receive coils is such that the same signal combinations from samples are received in different receive antennas), a pseudo-inverse matrix $I_{nm}$ may be determined from the sensitivity matrix $E_{mn}$ by singular value decomposition or bordering. In this case, a solution with minimum distance and improved signal-to-noise ratio may be defined using the method of least squares.

The inversion of the matrix may take place in a control unit of the magnetic resonance tomograph, for example, though a separate computing unit is also conceivable.

In a further possible act of the method, the captured magnetic resonance signals $S_m$ of the individual samples are recovered by multiplying the vector $A_N$ from the N antenna signals with the inverse matrix $I_{nm}$. The calculation may again be performed by a control unit of the magnetic resonance tomograph or an image reconstruction unit.

It is particularly advantageous in this case that the inverse matrix may be applied repeatedly to consecutive measurements of the antenna signals, as long as the relative arrangement of the receive antennas to the samples does not change. In this way, magnetic field measurements and evaluations with a high repeat rate are possible.

However, it is also conceivable in principle to solve the system of equations individually anew in each case. A multiplicity of mathematical solution methods exists for such overdeterminate systems of equations with coefficients that are susceptible to error. It is therefore conceivable, particularly in the case of an overdeterminate system of equations, that faster and/or more accurate solutions may be found in the case of certain combinations with specific input vectors or sensitivity matrices that are only partly complete.

In a possible embodiment variant of the method, the magnetic resonance tomograph has a gradient system and the field camera is arranged in the magnetic resonance tomograph. In this case, the act of capturing a sensitivity matrix also includes the act of determining a field gradient which subjects each sample to a different magnetic field. This condition is satisfied if more than one sample is not located on any plane perpendicular to the gradient vector of the field gradient. The determination may already take place when the field camera is being constructed, for example, by suitable arrangement of the samples in the space relative to a predetermined gradient vector. It is however also possible to define the gradient vector for a given distribution of the samples. It is also possible in this case to define different gradient vectors.

In a further act of the method, the determined field gradient is output by the gradient system during the capture of the sensitivity matrix $E_{mn}$, in particular during the nuclear spin.

In addition to the selective excitation of individual samples, it is also however possible to obtain a sensitivity matrix by combining a plurality of projections of the samples along different axes in one or two dimensions. This may be achieved by only sampling the k-space along one axis or only capturing the amplitudes.

In a possible embodiment variant of the method, the act of capturing a sensitivity matrix also includes the sub-acts of weighting the antenna signals with a time-dependent window function in order to sharpen a spectral distribution during the capture of the sensitivity matrix in the time segment. For example, a decreasing exponential function or a Hann function may be used for this purpose.

The magnetic resonance signals of the individual samples are shifted to different Larmor frequencies by the field gradients so that the signals may be distinguished. However, due to the finite length of the sampling window and the duration of the magnetic resonance signal that may be captured, the resolution in the Fourier range might not be sufficient for separation. A better resolution in the frequency range may advantageously be achieved by suitable weighting using a window function which also takes the exponentially decreasing signal strength into consideration.

BRIEF DESCRIPTION OF THE DRAWINGS

The properties, features, and advantages of this disclosure as described above, and the manner in which these are achieved, are made clearer and easier to understand in the context of the following description of the exemplary embodiments, which are explained in greater detail below with reference to the drawings, in which:

FIG. 4 depicts a schematic flow diagram of an example of a method.

DETAILED DESCRIPTION

Figure 1:
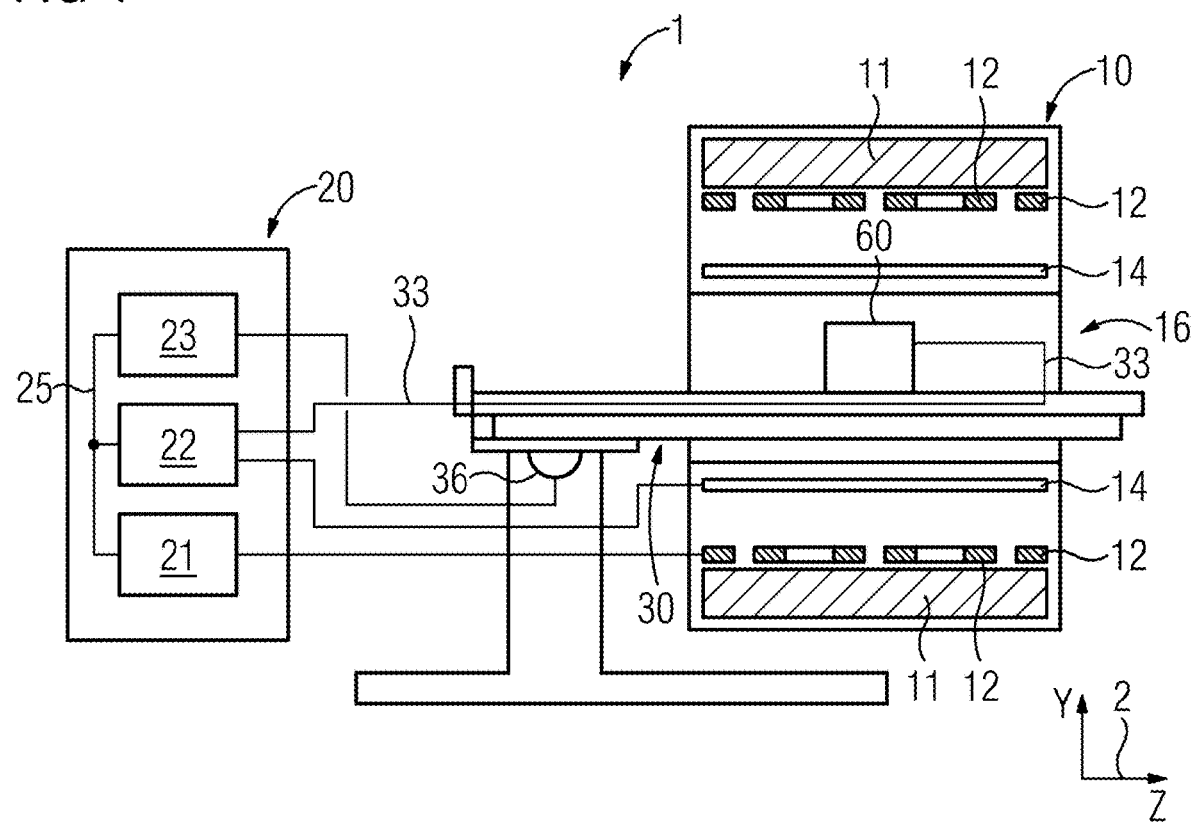
FIG. 1 depicts a schematic overview representation of an example of a magnetic resonance tomograph with a field camera.

FIG. 1 depicts a schematic representation of an embodiment variant of a magnetic resonance tomograph 1 with a field camera 60.

The magnet unit 10 has a field magnet 11, which generates a static magnetic field B0 in order to align nuclear spins of samples or of the patient in a recording region. The recording region is characterized by an extremely homogenous static magnetic field B0, the homogeneity relating to the magnetic field strength or the magnitude in particular. The recording region is almost spherical and is arranged in a patient tunnel 16 which extends in a longitudinal direction 2 through the magnet unit 10. A patient couch 30 may be moved in the patient tunnel 16 by the drive unit 36. The field magnet 11 may be a superconductive magnet which may provide magnetic fields having a magnetic flux density up to 3 T and even higher in the case of the latest machines. For lower field strengths, it is however also possible to use permanent magnets or electromagnets having normal conductivity.

The magnet unit 10 also includes gradient coils 12, which, in order to allow spatial differentiation of the captured image regions in the examination volume, are so configured as to overlay the magnetic field B0 with variable magnetic fields in three spatial directions. The gradient coils 12 may be coils of wires having normal conductivity, which may generate reciprocally orthogonal fields in the examination volume.

The magnet unit 10 also includes a body coil 14, which is configured to beam a high-frequency signal that is supplied via a signal cable into the examination volume, to receive resonance signals that are emitted from the patient 100 and to transmit these via a signal cable.

A control unit 20 supplies the magnet unit 10 with the various signals for the gradient coils 12 and the body coil 14 and evaluates the signals that are received.

The control unit 20 therefore includes a gradient controller 21, which is configured to supply the gradient coils 12 via feed cables with variable currents that provide the desired gradient fields in the examination volume in a temporally coordinated manner.

The control unit 20 also includes a high-frequency unit 22, which is configured to generate a high-frequency pulse with a predetermined time characteristic, amplitude, and spectral power distribution for the excitation of a magnetic resonance of the nuclear spin in the patient 100. Pulse powers in the kilowatt range may be achieved in this case. The excitation pulses may be beamed into the patient 100 via the body coil 14 or also via a local transmit antenna.

A controller 23 communicates via a signal bus 25 with the gradient controller 21 and the high-frequency unit 22.

Figure 2:
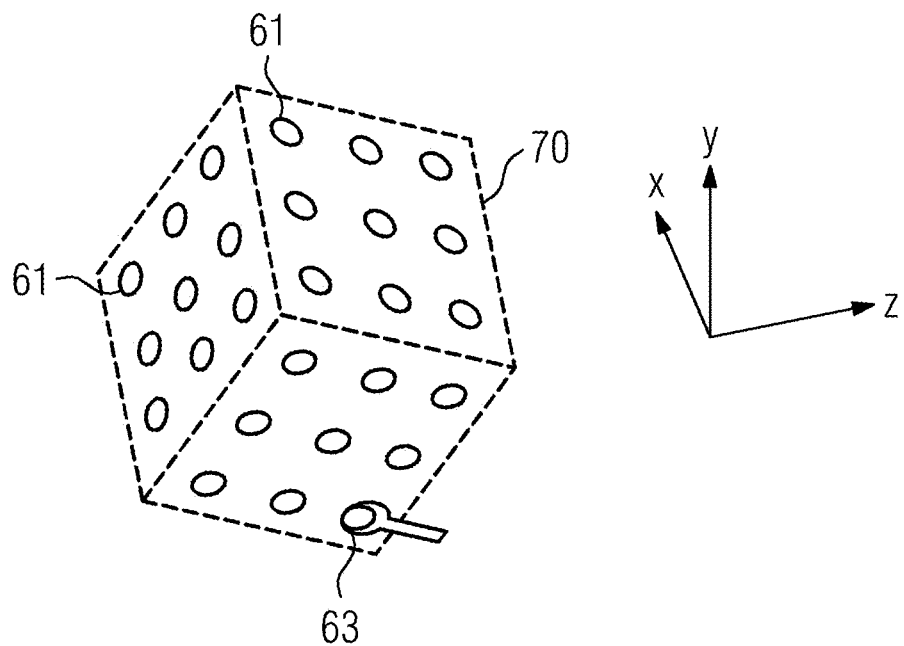
FIG. 2 depicts a schematic representation of an example of an arrangement of samples of a field camera.
Figure 3:
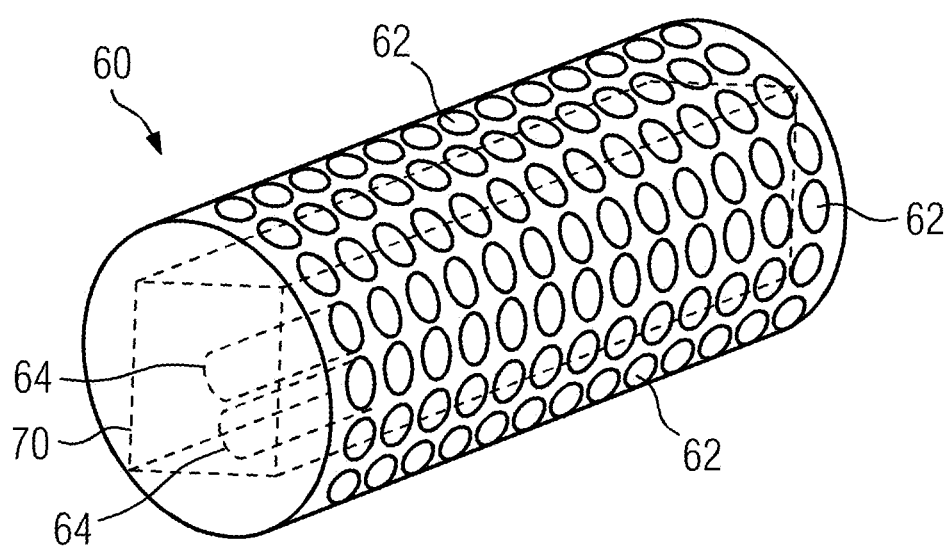
FIG. 3 depicts a schematic representation of an example of receive antennas of a field camera.

Instead of the patient, a field camera 60 is arranged on the patient couch 30 in order to measure the magnetic field in the patient tunnel 16. The field camera 60 includes the samples 61 and the receive antennas 62 as illustrated in FIG. 2 and FIG. 3, wherein a signal connection between the receive antennas 62 and receivers of the high-frequency unit 22 is provided by an interface cable 33. The signal connection may also be embodied wirelessly.

FIG. 2 schematically illustrates the samples 61 of a field camera 60.

The field camera 60 includes a number of M samples 61, which may be distributed at the surface of a spatial volume to be measured 70. The samples 61 include a material which is active in terms of nuclear spin resonance. They may be hydrogenous samples 61 such as water or hydrocarbon compounds. Liquid samples 61 may be held in cells or vials, for example. The samples 61 may be embedded in a matrix or a structural body which does not itself exhibit any nuclear spin resonance or is active on a different frequency. The size of the samples 61 is a compromise between spatial resolution and sensitivity in this case. The larger the samples 61, the smaller the spatial resolution.

The spatial volume 70 is illustrated as a cube here, so that the orientation of the spatial axes may be illustrated more easily. The spatial volume 70 may however assume any other desired shape, including, for example, sphere, ellipsoid, cylinder, prism, or similar arrangements which at least partially occupy the recording region. An arrangement of the samples 61 on one or more concentric spherical shells is also advantageous, because the fields in the interior may be determined from the fields at the surface of a zero-divergence volume on the basis of magnetic field laws.

For the purpose of the method, it is advantageous in this case to arrange the samples 61 in such a way that only one is ever situated on a plane perpendicular to a gradient vector. In the method explained with reference to FIG. 4, this allows the samples 61 to be distinguished on the basis of the Larmor frequency under the influence of the magnetic gradient.

This may be achieved by arranging the samples 61 in a regular grid whose axes of symmetry are suitably tilted relative to the basic axes x, y, and z of the gradient coils 12.

However, a random or regular distribution is also conceivable. It is finally also conceivable, even if the axes of the arrangement of the samples 61 are parallel to the axes of the gradient coils 12, for a magnetic field gradient to be generated by a suitable superimposition of the magnetic fields of the gradient coils 12 in such a way that the condition is satisfied.

In order to accelerate the measurement, it is also conceivable to provide interference coils 63 around the individual samples 61, wherein the interference coils 63 may be subjected to a direct or high-frequency current in order to allow a faster decay of any residual excitation, such that the next measurement may follow more quickly.

Finally, as explained with reference to the method, the relative sensitivity of the individual receive antennas 62 for the individual samples 61 may also be determined by a plurality of magnetic resonance images of the samples 61, with projection onto a two-dimensional surface or a one-dimensional line.

For the sake of clarity, the receive antennas 62 of the field camera 61 are illustrated separately in FIG. 3 by way of example. The receive antennas 62 each have a receive volume 64 and are arranged relative to the spatial volume to be measured such that two of the M samples are arranged in at least one of the receive volumes 64, and the receive volumes 64 are at least partially separate and at least one sample is arranged in each receive volume. In this way, the number N of the receive antennas (e.g., 91 antenna as depicted in FIG. 3) is greater than or equal to the number M of samples (e.g., 27 samples as depicted in FIG. 2).

FIG. 3 illustrates a possible configuration of receive antennas 62 of the field camera 60. The receive antennas 62 here are illustrated as antenna coils by way of example. The outer extent of the spatial volume 70 is at least partially surrounded by the receive antennas 62 in this case. For the sake of clarity, the samples 61 within the spatial volume 70 are not illustrated in FIG. 3 but are arranged within the spatial volume 70 as illustrated in FIG. 2.

In FIG. 3, the receive antennas 61 are arranged at the outer extent of a hollow body. As illustrated, this may also be a head coil, for example, which receives magnetic resonance signals from the internal space using 64 individual receive coils as receive antennas 62 as per a customary model, specifically by arranging the spatial volume 70 with the samples 61. It is thus possible to provide a field camera at little expense in the context of an existing head coil, by using an economical passive matrix with the samples 61.

The concept of the present disclosure in this case is that the signals of the individual samples 61 may be recovered from the receive signals of the receive antennas 62 if the signals of the M samples 61 and the N antenna receive signals form a solvable linear system of equations.

For this, the number N of receive antennas 62 is greater than or at least equal to the number M of samples. Furthermore, the signals from all samples 61 is received by at least one receive antenna 62 in each case. By way of example, a receive volume 64 for a receive antenna 62 is outlined in FIG. 3. The contour in this case indicates the surface at which signals from samples 61 are attenuated by a predetermined value relative to a sample in the middle of the antenna coil, e.g., by 6 dB, 12 dB, 18 dB, or 40 dB. The receive volume 64 is limited most by the distance at which the receive signal falls below the noise level. The receive volume 64 of the receive antenna 62 in FIG. 3 is a lobar shape which extends radially inward. For the sake of clarity, the lobe extending radially outward is not illustrated.

In order for the system of equations to be solvable when N=M, the receive volumes 64 of two receive antennas 62 is not identical in the sense that both receive antennas 62 return the same signal level, or a signal level that is scaled with the same factor, for the same samples 61. However, a 1:1 assignment of receive antennas 62 to samples 61 is not necessary, and instead some receive antennas 62 may cover a large receive volume 64 while others detect only one individual sample 61.

One way of specifying the linear system of equations between samples 61 and signals of the receive antennas 62 is to determine the receive signal of all N receive antennas 62 for an individual sample 61 in each case, for all M samples 61 one after the other. This is possible, for example, if only one sample 61 is excited or if the signals are distinguishable.

This may be achieved, for example, by applying a magnetic field gradient whereby each sample 61 is subjected to a different static magnetic field of magnetic field B0 and gradient field. On one hand, it is then possible for only one individual sample 61 to be excited using a narrowband excitation pulse and for the receive antennas 62 to evaluate the individual signal of this sample 61.

Alternatively, in the case of broadband excitation, the signals of all samples 61 may be received by all receive antennas 62 and separated in the frequency range on the basis of the different frequencies. Measures for improved frequency separation are described below in relation to the method.

In an embodiment variant with interference coils 63 around the individual samples, it is however also conceivable to excite one sample selectively in each case with one excitation pulse using the interference coil 63.

An exemplary head coil with a number of 64 receive antennas 62 in connection with up to 64 samples 61 may therefore measure a magnetic field in the interior of the head coil. For this purpose, it is simply necessary to arrange the samples 61 in a matrix or a shaped body as described above and then to arrange this at a predetermined position in the head coil, such that the individual excitation and different receive signals are possible as described above.

Using resonant coils at the samples as a first resonant circuit, it is also possible to improve a coupling of the samples 61 with the excitation pulse and/or the receive antennas 62 and thus to improve the signal strength and the SNR. The first resonant circuit may also have two different resonant frequencies in this case, e.g., by coupling two oscillating circuits, such that the signal amplification is also possible with different static B0 fields.

The coupling may also be further improved by a two-stage model featuring a first resonant circuit directly at the sample and a second resonant circuit at a greater distance but with a larger induction surface of the antenna coil.

FIG. 4 depicts a schematic flow diagram of a method for measuring a magnetic field distribution using a magnetic resonance tomograph 1 and a field camera 60.

In an act S100, a sensitivity matrix for the receive antennas is captured, having a sensitivity $E_{mn}$ for each sample m at each receive antenna n. For this purpose, the signal response for at least M samples and, e.g., N (where N>M) receive antennas 62 is captured for a predetermined excitation of each sample m. For a signal vector with the magnetic resonance signals $S_m$ of the M samples 61 and an antenna signal vector with the receive signals $A_n$ of the N receive antennas 62, the following system of equations is produced:

$$A_n = E_{mn} \times S_m$$

In a possible embodiment variant for defining the matrix elements of the sensitivity matrix, each of the M samples 61 is individually excited one after the other. This may be achieved by generating a magnetic field gradient in an act S120, for example, wherein each of the M samples 61 is subjected to a magnetic field of different magnitude in each case. This may be achieved as described above by arranging the samples relative to the magnetic field gradients in such a way that only one sample 61 is ever arranged in a plane perpendicular to the gradient vector. In this case, it is possible on one hand for the samples 61 to be aligned in the X-, Y-, or Z-direction according to a gradient vector of the individual gradient coils 12, such that it is merely necessary to apply current to the respective gradient coil 12. Alternatively, a suitable gradient vector is determined in an act S110 and a gradient vector in a suitable direction relative to the samples 61 is generated in an act S120 by superimposing the fields of the three gradient coils 12.

If each of the M samples is subjected to a respectively different magnetic field composed of the gradient magnetic field and the static magnetic field B0, these also have different Larmor frequencies. By a narrowband excitation pulse at the respective Larmor frequency, a single sample may then be excited individually in each case and the magnetic resonance signal of this one sample 61 may then be received by all N receive antennas 62 in order to capture the respective matrix elements of the sensitivity matrix $E_{mn}$.

It is also conceivable to emit a broadband excitation pulse under the influence of the same magnetic field gradient, the excitation pulse containing signal portions having the Larmor frequency of all samples under the influence of this magnetic field gradient and the static magnetic field B0. The M samples are then all excited simultaneously. If the magnetic resonance signals are then recorded by the receive antennas 62 with unchanged magnetic fields, they represent a superimposition of a plurality of magnetic resonance signals of different samples 61. Because the Larmor frequencies differ, however, separation in the frequency range may take place after a Fourier transformation, for example, and the individual elements of the sensitivity matrix $E_{mn}$ may be determined thus.

If the frequency distance is not sufficient for a clean separation, the discrimination may be improved in an act S130 by weighting the receive signals of the receive antennas 62 using a window function such as the Hann function or the Gauss function. Moreover, the natural decay of the magnetic resonance signal may be compensated and the line width reduced by an exponentially increasing weighting.

It is also conceivable to improve the discrimination by a combination of selective excitation and evaluation in the frequency range. Individual samples may be excited either selectively or in a plurality of layers that are separate from each other.

Finally, in the case of an embodiment variant with interference coils 63 around the individual samples 61, it is conceivable to excite the interference coils 63 by an excitation pulse applied to the respective interference coil 63 for selective local excitation of an individual sample 61.

In an act S300, the magnetic resonance signals of the individual samples from the antenna signals may be determined as a function of the sensitivity matrix, using a controller. In certain embodiments, an inverse matrix may be used in such a determination. For example, in an act S310, an inverse matrix $I_{nm}$ to the sensitivity matrix $E_{mn}$ is defined. For this, the number N of receive antennas is at least as great as the number M of samples. In this case, the sensitivity matrix $E_{mn}$ specifies a system of equations which may be inverted under certain conditions, so that the magnetic resonance signals of the individual samples 61 may be deduced from the receive signals or the amplitude $A_n$ of the receive antennas 62.

This is performed mathematically using a matrix $I_{nm}$ which is inverse to $E_{mn}$. A quadratic matrix $E_{mn}$ may be inverted in this case if the determinant is not equal to 0. The vector of magnetic resonance signals is then obtained according to $S_m = I_{nm} \times A_n$ from the receive signals $A_n$ of the receive antennas 62.

If the number of receive antennas 62 is greater than the number M of samples 61, the term inverse matrix is not then restricted to the narrow mathematical term for quadratic matrices where M=N, but also includes the so-called pseudo-inverse matrices where N>M, e.g. the Moore-Penrose inverse.

In order to achieve this, the system of equations of the sensitivity matrix $E_{mn}$ is not underdeterminate. If the system of equations is overdeterminate, (e.g., the number N of receive antennas 62 is greater than the number M of samples 61 and the arrangement of the samples 61 relative to the receive antennas 62 is such that non-identical linear combinations of signals from samples 61 are received in different receive antennas 62), a pseudo-inverse matrix $I_{nm}$ may be determined from the sensitivity matrix by singular value decomposition or bordering. From this, a solution with minimum distance and improved signal-to-noise ratio for the magnetic resonance signals $S_m$ of the samples 61 may again be defined using the method of least squares.

The inversion of the matrix may take place in a control unit 20 of the magnetic resonance tomograph 1, for example, though a separate computing unit or a computing unit that is used for the image reconstruction is also conceivable.

In a further act S200, N antenna signals $A_n$ of the M samples 61 in a magnetic field to be measured are captured by the N receive antennas 62. In order to achieve this, the samples 61 are first excited by an excitation pulse with the Larmor frequency in an expected magnetic field B0. Because the separation of the magnetic resonance signals of the individual samples 61 is then effected based on the spatial diversity of the sensitivity matrix $E_{mn}$ or the inverse $I_{nm}$ thereof, it is not necessary to subject the individual samples 61 to a different magnetic field by a gradient. The excitation may therefore take place using a narrowband shared excitation pulse whose frequency is the Larmor frequency of the samples 61 in the expected static magnetic field B0. The bandwidth of the excitation pulse need only be large enough to compensate for inhomogeneities of the static magnetic field B0. The receive antennas 62 then capture the N amplitude values or the vector of the antenna signals $A_n$ of the M samples 61.

In an act S320, the magnetic resonance signals $S_m$ of the individual samples 62 are then determined by multiplying the vector $A_N$ with the inverse matrix $I_{nm}$. In the case of an overdeterminate matrix where N>M, instead of the quadratic inverse matrix, use is made of a pseudo-inverse matrix or a system of equations which may be solved using the method of least squares, for example.

The inverse matrix advantageously remains unchanged in this case, as long as the sensitivity matrix is not changed as a result of spatial changes, for example. The inverse matrix may therefore be used for rapid calculation of the magnetic resonance signals for a multiplicity of measurements in quick succession.

However, using particular configurations of receive antennas 62 and/or samples 61, other solution methods for the underlying system of equations $A_n = E_{mn} \times S_m$ may also produce a result that is more accurate or quicker. The solution of the system of equations may equally take place individually after each measurement as a function of the respective antenna signals and be configured thereto.

An evaluation of the individual magnetic resonance signals $S_m$ thus obtained for the individual samples 61 according to the frequency, e.g. using a Fourier transformation, in turn produces a value which is directly proportional to the magnetic field at the location of the sample 61. The evaluation may take place on the control unit 20 of the magnetic resonance tomograph 1.

The magnetic field value thus determined may be output to a user via a display, in order to assess the homogeneity of the magnetic field B0. It is however also possible for the control unit 20, on the basis of the B0 values, to determine and output a setting for shim currents in shimming coils of the magnetic resonance tomograph 1, in order to improve the homogeneity of the static magnetic field B0.

Although the disclosure has been illustrated and described in greater detail by the exemplary embodiments, the disclosure is not restricted by these exemplary embodiments. Other variations may be derived herefrom by the person skilled in the art, without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for measuring a magnetic field distribution using a magnetic resonance tomograph and a field camera, the method comprising:
   providing the field camera having a plurality of samples distributed over a spatial volume to be measured and a plurality of receive antennas, wherein the field camera is arranged in the magnetic resonance tomograph, wherein each receive antenna of the plurality of receive antennas has a receive volume, wherein the receive antennas are arranged relative to the spatial volume to be measured in such a way that two samples of the plurality of samples are arranged in at least one receive volume of the receive volumes, wherein the receive volumes are at least partially separate, wherein at least one sample of the plurality of samples is arranged in each receive volume, and wherein a number of receive antennas is greater than or equal to a number of samples;
   capturing a sensitivity matrix for the plurality of receive antennas, with a sensitivity for each sample at each receive antenna, using the magnetic resonance tomograph, wherein the capturing of the sensitivity matrix further comprises determining a magnetic field gradient under whose influence each sample is subjected to a different magnetic field and generating the determined magnetic field gradient by a gradient system of the magnetic resonance tomograph during the capture of the sensitivity matrix;
   capturing, by the plurality of receive antennas, antenna signals of the plurality of samples in a magnetic field to be measured, using the magnetic resonance tomograph; and
   determining magnetic resonance signals of individual samples of the plurality of samples from the antenna signals as a function of the sensitivity matrix, using a controller.

2. The method of claim 1, further comprising:
   defining an inverse matrix to the sensitivity matrix; and
   determining the magnetic resonance signals of the individual samples by multiplying a vector with the inverse matrix.

3. The method of claim 1, wherein the receive antennas at least partially surround an outer extent of the spatial volume to be measured.

4. The method of claim 3, wherein at least one sample of the plurality of samples has an inductively coupled first resonant circuit at a Larmor frequency.

5. The method of claim 1, wherein at least one sample of the plurality of samples has an inductively coupled first resonant circuit at a Larmor frequency, and
   wherein the first resonant circuit has an inductance in a form of a coil surrounding the at least one sample at a distance that is smaller than a dimension of the at least one sample in a plane in which the coil lies.

6. The method of claim 5, wherein the first resonant circuit has two different resonant frequencies.

7. The method of claim 5, wherein the field camera has a second resonant circuit,
   wherein the first resonant circuit is inductively coupled to the second resonant circuit.

8. The method of claim 5, wherein the first resonant circuit has the coil.

9. The method of claim 8, wherein the first resonant circuit has two different resonant frequencies.

10. The method of claim 9, wherein the field camera has a second resonant circuit, and
    wherein the first resonant circuit is inductively coupled to the second resonant circuit.

11. A method for measuring a magnetic field distribution using a magnetic resonance tomograph and a field camera, the method comprising:
    providing the field camera having a plurality of samples distributed over a spatial volume to be measured and a plurality of receive antennas, wherein each receive antenna of the plurality of receive antennas has a receive volume, wherein the receive antennas are arranged relative to the spatial volume to be measured in such a way that two samples of the plurality of samples are arranged in at least one receive volume of the receive volumes, wherein the receive volumes are at least partially separate, wherein at least one sample of the plurality of samples is arranged in each receive volume, and wherein a number of receive antennas is greater than or equal to a number of samples;
    capturing a sensitivity matrix for the plurality of receive antennas, with a sensitivity for each sample at each receive antenna, using the magnetic resonance tomograph, wherein the capturing of the sensitivity matrix further comprises weighting antenna signals with a time-dependent window function in order to sharpen a spectral distribution during the capturing of the sensitivity matrix;

capturing, by the plurality of receive antennas, the antenna signals of the samples in a magnetic field to be measured, using the magnetic resonance tomograph; and determining magnetic resonance signals of individual samples of the plurality of samples from the antenna signals as a function of the sensitivity matrix, using a controller.

12. The method of claim 11, wherein the receive antennas at least partially surround an outer extent of the spatial volume to be measured.

13. The method of claim 12, wherein at least one sample of the plurality of samples has an inductively coupled first resonant circuit at a Larmor frequency.

14. The method of claim 11, wherein at least one sample of the plurality of samples has an inductively coupled first resonant circuit at a Larmor frequency, and wherein the first resonant circuit has an inductance in a form of a coil surrounding the at least one sample at a distance that is smaller than a dimension of the at least one sample in a plane in which the coil lies.

15. The method of claim 14, wherein the first resonant circuit has the coil.

16. The method of claim 15, wherein the first resonant circuit has two different resonant frequencies.

17. The method of claim 16, wherein the field camera has a second resonant circuit, and wherein the first resonant circuit is inductively coupled to the second resonant circuit.

18. The method of claim 14, wherein the first resonant circuit has two different resonant frequencies.

19. The method of claim 14, wherein the field camera has a second resonant circuit, wherein the first resonant circuit is inductively coupled to the second resonant circuit.

20. A non-transitory computer-readable storage medium on which is stored electronically readable control information, wherein the electronically readable control information, when executed by a controller of a magnetic resonance tomograph, is configured to cause the magnetic resonance tomograph to:

capture a sensitivity matrix for a plurality of receive antennas of a field camera arranged in the magnetic resonance tomograph, with a sensitivity for each sample of a plurality of samples at each receive antenna of the plurality of receive antennas, wherein each receive antenna has a receive volume, and wherein each sample of the plurality of samples comprises a volume having a medium whose nuclear spins have a magnetic resonance, wherein the capture of the sensitivity matrix further comprises:

(1) determining a magnetic field gradient under whose influence each sample is subjected to a different magnetic field and generating the determined magnetic field gradient by a gradient system of the magnetic resonance tomograph during the capture of the sensitivity matrix, or (2) weighting antenna signals with a time-dependent window function in order to sharpen a spectral distribution during the capture of the sensitivity matrix;

capture, by the plurality of receive antennas, the antenna signals of samples in a magnetic field to be measured, wherein the receive antennas are arranged relative to a spatial volume to be measured in such a way that two samples of the plurality of samples are arranged in at least one receive volume of the receive volumes, wherein the receive volumes are at least partially separate, wherein at least one sample of the plurality of samples is arranged in each receive volume, and wherein a number of receive antennas is greater than or equal to a number of samples; and determine the magnetic resonance signals of individual samples of the pluarlity of samples from the antenna signals as a function of the sensitivity matrix.

* * * * *